United States Patent [19]

Reilly et al.

[11] 4,344,040
[45] Aug. 10, 1982

[54] METHOD AND APPARATUS FOR PROVIDING THE IN-PHASE AND QUADRATURE COMPONENTS OF A BANDPASS SIGNAL

[75] Inventors: James P. Reilly, Hamilton; Simon Haykin, Ancaster, both of Canada

[73] Assignee: Canadian Patents & Development Limited, Ottawa, Canada

[21] Appl. No.: 133,911

[22] Filed: Mar. 26, 1980

[51] Int. Cl.³ .......................................... H03D 3/18
[52] U.S. Cl. ............................. 329/50; 329/122; 329/167; 455/214; 455/337
[58] Field of Search ............. 329/50, 110, 122, 124, 329/126, 167; 328/151; 455/337, 214; 375/84, 87

[56] References Cited

U.S. PATENT DOCUMENTS

| | | | |
|---|---|---|---|
| 3,925,732 | 12/1975 | Tanaka et al. | 329/126 X |
| 4,224,575 | 9/1980 | Mosley et al. | 328/151 X |
| 4,253,067 | 2/1981 | Caples et al. | 329/110 |

*Primary Examiner*—Siegfried H. Grimm
*Attorney, Agent, or Firm*—Edward Rymek

[57] ABSTRACT

The method and apparatus provides the in-phase I and quadrature Q components of a bandpass signal x(t) of center frequency $f_c$ and bandwidth 2w. The signal x(t) is heterodyned to have an intermediate center frequency $f_o$ where $w \leq f_o \leq f_c$. This signal is divided into two signals and each is sampled during successive periods $T_s$ where $T_s = m/f_o$ and m is an integer. However, the instant of sampling of one signal is shifted with respect to the other by $b/4f_o$ where b is an odd integer. In the various implementations, the shift may be either positive, negative, or both, to provide the quadrature component Q, whereas the sampling of the other signal provides the in-phase component I.

15 Claims, 5 Drawing Figures

METHOD AND APPARATUS FOR PROVIDING THE IN-PHASE AND QUADRATURE COMPONENTS OF A BANDPASS SIGNAL

BACKGROUND OF THE INVENTION

This invention is directed to a novel method and apparatus for acquiring the in-phase and quadrature components of a bandpass signal.

In digital signal processing systems, it is necessary to extract information from a bandpass signal x(t) of center frequency $f_c$ and bandwidth 2w by the implementation of a sampling process. This sampling process must acquire both the in-phase (I) and quadrature (Q) components of x(t). The bandpass signal x(t) may be represented mathematically as $$x(t) = x_c(t) \cos(2\pi f_c t) - x_s(t) \sin(2\pi f_c t) \qquad (1)$$

where $x_c(t)$ and $x_s(t)$ are baseband (low pass) signals. The sampling process must acquire from x(t) sampled versions of both $x_c(t)$ and $x_s(t)$.

In the conventional method and apparatus for obtaining the samples of $x_c(t)$ and $x_s(t)$ the signal x(t) is fed into two separate mixers whose local oscillator feeds are 90° apart in phase. After passing the mixer output signals through low pass filters and samplers, the signals so obtained are sampled versions of $x_c(t)$, and $x_s(t)$, namely $kx_c(nT)$ and $kx_s(nT)$, where k is the amplifier gain constant and T is the sampling period.

This method requires two near identical channels with matching mixers, filters and amplifiers. This hardware requirement can be both costly and sometimes difficult to implement. The method also suffers from the fact that since $x_c(t)$ and $x_s(t)$ are both baseband signals, any amplification of $x_c(t)$ or $x_s(t)$ which may be required before sampling must be accomplished with DC amplifiers, which are much more cumbersome and expensive to design than AC amplifiers. An example of this type of system is described in U.S. Pat. No. 3,705,360, which issued to G. Rabow on Dec. 5, 1972.

SUMMARY OF THE INVENTION

It is therefore an object of this invention to provide novel methods and apparatus for obtaining the in-phase and quadrature components of a bandpass signal.

It is a further object of this invention to provide apparatus for more efficiently determining the in-phase and quadrature components of a bandpass signal.

In accordance with one aspect of this invention, the I and Q components can be determined by dividing the bandpass signal x(t) of center frequency $f_c$ and bandwidth 2w into two, and sampling each of the divided signals during successive periods $T_s$ where $T_s = m/f_c$ and m is an integer. The I component is obtained by sampling one divided signal at an instant during periods $T_s$. The Q component is obtained by sampling the other divided signal at instants shifted with respect to the sampling instant used to obtain the I component by $b/4f_c$, where b is an odd integer. The shift $b/4f_c$ may be positive or negative to provide one sample per period $T_s$, or it may be both to provide two samples per period $T_s$.

In accordance with another aspect of this invention, the signal x(t) may first be heterodyned from its original center frequency $f_c$ to an intermediate center frequency $f_o$ where $w \leq f_o \leq f_c$. With this method, the sampling period $T_s = m/f_o$.

In accordance with a further aspect of the invention, it is preferred that $$-m \leq \frac{b+1}{2} \leq m$$

and that $f_o \geq 20w$ to keep any time shift error in the quadrature component to a minimum.

Many other objects and aspects of the invention will be clear from the detailed description of the drawings.

DETAILED DESCRIPTION OF THE EMBODIMENTS

The method of obtaining the in-phase, I, and quadrature, Q, components of a bandpass signal x(t) in accordance with the present invention, is described with reference to the apparatus shown in FIG. 1. The input bandpass signal x(t) has a center frequency $f_c$ and a bandwidth of 2w. Signal x(t) is represented by equation (1) referred to above and reproduced here for convenience:

$$x(t) = x_c(t) \cos(2\pi f_c t) - x_s(t) \sin(2\pi f_c t) \qquad (1)$$

Figure 2:
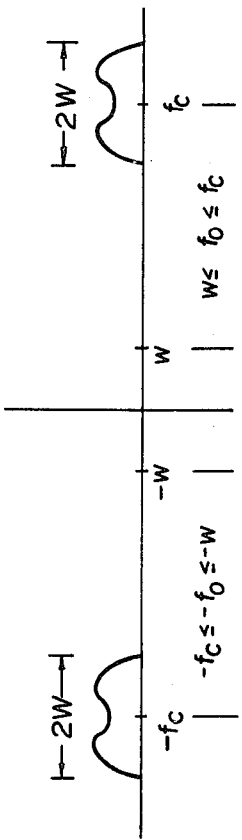
FIG. 2 illustrates a possible amplitude spectrum of the bandpass signal.

The amplitude spectrum of x(t) is shown in FIG. 2. Signal x(t) is applied to a mixer 1, to which is coupled a reference signal $f_d = (f_c - f_o)$.

Figure 1:
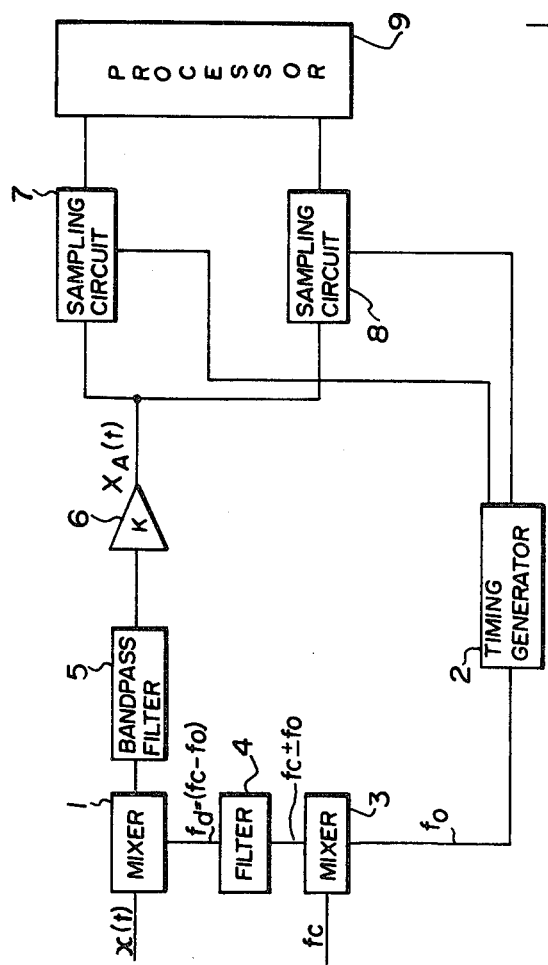
FIG. 1 illustrates the apparatus for obtaining in-phase and quadrature components from a bandpass signal.

In a possible implementation of the system, shown in FIG. 1, signal x(t) is heterodyned from its center frequency $f_c$ to an intermediate center frequency $f_o$ in the mixer 1. As shown in FIG. 2, $w \leq f_o \leq f_c$. The signal of frequency $f_d$ follows the actual carrier frequency $f_c$ of the signal x(t). This is done by recovering the center frequency signal $f_c$ from the input signal x(t) in the receiver, and applying it to a mixer 3 together with a signal of frequency $f_o$ which is provided by a stable reference timing generator 2. The mixer 3 output is applied to a narrow bandpass filter 4 which provides the output $f_d = f_c - f_o$.

The output from the mixer 1 is fed, through a bandpass filter 5 of bandwidth 2 w and of center frequency $f_o$, to an AC amplifier 6 which has a gain of k. The amplified output signal $x_A(t)$ can be represented by:

$$x_A(t) = kx_c(t) \cos(2\pi f_o t) - kx_s(t) \sin(2\pi f_o t) \qquad (2)$$

In the case where $f_o = f_c$, mixers 1 and 3 and filter 4 are not required, and the input signal x(t) is applied directly to bandpass filter 5 of center frequency $f_c$.

The signal $x_A(t)$ is fed into two separate sampling circuits 7 and 8. Sampling circuits 7 and 8 are controlled by the reference timing generator 2 so that both sampling circuits 7 and 8 sample the signal $x_A(t)$ during the same successive time period $T_s = m/f_o$ where m is an integer. However, the instant of sampling for sampling circuit 8 is shifted with respect to the sampling instant of sampling circuit 7. In accordance with the sampling theory of bandpass signals, in-phase and quadrature samples must be obtained at a rate equal to or greater than ½ of the signal bandwidth 2 w, and therefore $f_s \leq w$ or $T_s \geq 1/w$. In the case where $f_o = w$, then $T_s = m/f_o = m/w$ and m must be 1. However, as the frequency $f_o$ increases toward $f_c$, m can increase toward $f_c/w$ to maintain the required minimum sampling rate.

The output $x_I$ from sampling circuit 7 can be represented by the equation:

$$x_I = x_A\left(i\frac{m}{f_o}\right)$$

$$= kx_c\left(i\frac{m}{f_o}\right)\cos\left(2\pi f_o i\frac{m}{f_o}\right) - kx_s\left(i\frac{m}{f_o}\right)\sin\left(2\pi f_o i\frac{m}{f_o}\right)$$

where i is the sampling index for sequentially numbering each sequential sample of the signal $x_A(t)$. Since i is always an integer and since m is a fixed integer, $$-\sin(2\pi i\, m) = 0$$

and $\cos(2\pi i\, m) = 1$ therefore:

$$x_I = kx_c\left(i\frac{m}{f_o}\right) = kx_c(iT_s) \quad (3)$$

which directly represents the in-phase component of $x(t)$.

As indicated above, the instant of sampling for sampling circuit 8 is shifted with respect to the instant of sampling for sampling circuit 7. The amount of shift is $(b)/(4f_o)$ where b is a plus or minus odd integer: $\pm 1, \pm 3, \pm 5, \pm 7, \ldots$ The output $x_Q$ from sampling circuit 8 can be represented by the equation:

$$X_Q = x_A\left(i\frac{m}{f_o} + \frac{b}{4f_o}\right) \quad (4)$$

$$= kx_c\left(i\frac{m}{f_o} + \frac{b}{4f_o}\right)\cos\left[2\pi f_o\left(i\frac{m}{f_o} + \frac{b}{4f_o}\right)\right] -$$

$$kx_s\left(i\frac{m}{f_o} + \frac{b}{4f_o}\right)\sin\left[2\pi f_o\left(i\frac{m}{f_o} + \frac{b}{4f_o}\right)\right]$$

where i is the sample index for sequentially numbering each sequential sample.

Since i is always an integer, m is a fixed integer and b is an odd integer, $$\cos\left[2\pi\left(im + \frac{b}{4}\right)\right] = 0$$

and $$-\sin\left[2\pi\left(im + \frac{b}{4}\right)\right] = \pm 1,$$

depending on the value of b.
Therefore, $$x_Q = \pm kx_s\left(i\frac{m}{f_o} + \frac{b}{4f_o}\right) \quad (5)$$

$$= \pm kx_s\left(iT_s + \frac{b}{4f_o}\right)$$

which represents the quadrature component of $x(t)$ except that there is a time shift of $b/4f_o$ seconds, and a possible change in polarity.

The outputs $x_I$ and $x_Q$ from the sampling circuits 7 and 8 represent the in-phase and quadrature components of $x(t)$ and are fed to a conventional processor 9 for converting the analog samples to digital form and processing the information contained therein.

The effect of the time shift of $b/4f_o$ may either be corrected or neglected. In order to correct the effect, the Fourier transform $X_s(f)$ of $x_s(t)$ must be considered. Since the Fourier transform of $x_s)t + T_o)$ is $X_s(f)\cdot\exp(-j2\pi fT_o)$, the Fourier transform of $$x_s\left(t + \frac{b}{4f_o}\right) \text{ is } X_s(f) \cdot \exp\left(+j2\pi f\frac{b}{4f_o}\right).$$

Then, in systems where the Fourier transformations of $x_c(t)$ and $x_s(t)$ are required and computed in processor 9, the effects of the time shift $$\frac{b}{4f_o} \text{ in } x_s\left(t + \frac{b}{4f_o}\right)$$

may be efficiently corrected by multiplying its frequency domain representation $$X_s(f)\exp\left(+j2\pi f\frac{b}{4f_o}\right) \text{ by the exponential factor } \exp\left(-j2\pi f\frac{b}{4f_o}\right)$$

to produce the desired frequency representation $X_s(f)$ of the unshifted time signal $x_s(t)$.

However, under certain conditions, the time shift effect need not be corrected. This will be the case if the percent bandwidth is small, i.e. if $(2\pi wb)/(4f_o)$ is smaller than about 0.05. Thus the values of either or both b and $f_o$ may be selected to keep the effect of the induced time shift small. Since b is either a positive or negative odd integer, and the effect of the induced time shift varies directly with b, it is preferred that be as small as possible, i.e. equal to $\pm 1$ or at least less than or equal to $\pm(2m-1)$. On the other hand, the effect of the induced time shift varies inversely with $f_o$ and therefore it would be desirable to keep $f_o$ large. As indicated above, it has been found that if the total % bandwidth of the signal $x_A(t)$ is less than about 10%, the time shift effect can be ignored. This case can be accomplished by selecting $f_o$ to be equal to or slightly greater than 20 w. At the same time, $f_o$ is still low enough to allow the use of conventional low priced and yet stable components.

As stated above, it is preferred that $f_o \geq 20$ w; however, it is also desirable that the frequency of $f_o$ be kept within that order of magnitude so that low frequency components can be used in the circuit. For example, mixers 1 and 3, filters 4 and 5, and amplifier 6 are standard components. Sampling circuits 7 and 8 may be a CMOS switch in an integrated circuit 4016 chip which samples and holds the sampled value for the processor 9 until the next sampling takes place under the control of reference oscillator 2.

Communications systems or coherent radar systems are examples of where this invention may be applied to advantage.

In a communications system, the received signal is usually brought down to an I.F. frequency for amplifying and filtering before it is brought down completely to baseband. In this case, mixer 3 and filter 4 in FIG. 1 are not required, and the frequency source $f_d$ is supplied by the external system. Then, the I.F. carrier must be recovered from the signal $x_A(t)$ and then this recovered carrier would be used to control the reference timing generator 2 to produce a sampler control signal. It is to be noted that for demodulation to baseband in a conventional system, the I.F. carrier must be recovered anyway. Hence, the requirement of carrier recovery for this system poses no extra need for additional equipment over a conventional technique.

In the process of demodulation of the signal down to baseband, this system has the advantage over prior art in that samples of the in-phase and quadrature components may be obtained with simple circuit configurations and inexpensive components. The component requirement is two samplers and a reference generator, and both items generally may be constructed out of readily available, inexpensive integrated circuits.

In a coherent radar system, the reference timing generator 2, mixer 3, filter 4, mixer 1, and bandpass filter 5 of FIG. 1 are all components of the standard conventional system design. As in the communications system example, the novelty of the invention pertains to the sampling/demodulation process, and the invention may be employed in this instance to realize the same advantages as were discussed in the communications system example.

In addition, the present invention can provide substantial savings in phased array radar systems where the need for a mixer for each antenna element may be eliminated.

Figure 3:
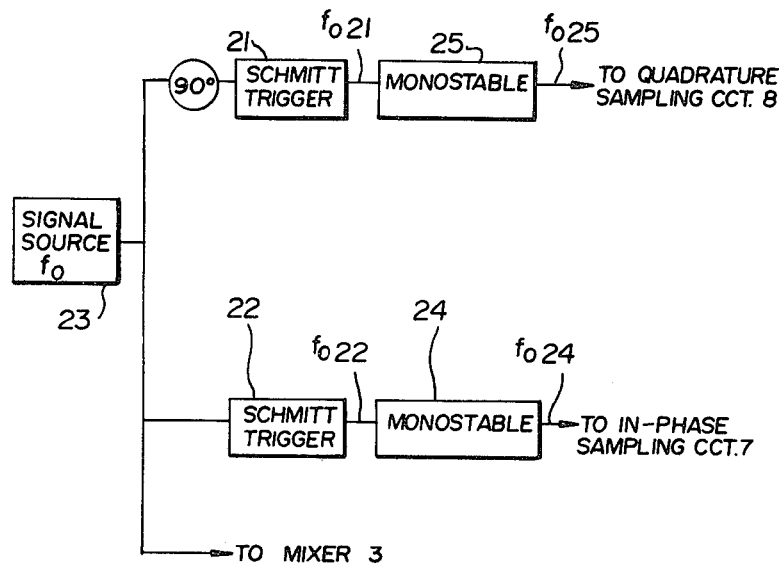
FIG. 3 illustrates a reference time generator for use with the apparatus in FIG. 1.
Figure 4:
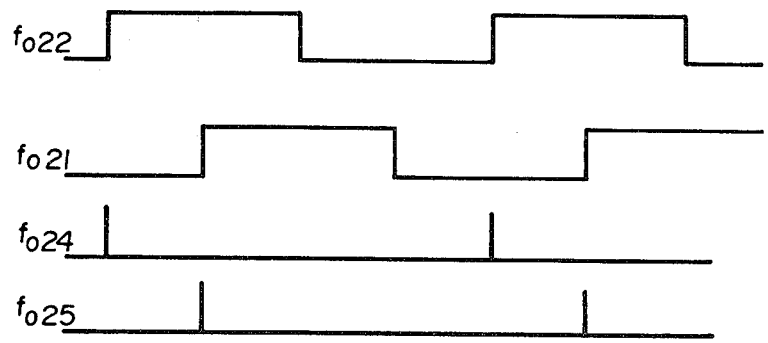
FIG. 4 shows the three output signals of the reference oscillator in FIG. 3, for the case when m=1 and b=+1.

One embodiment of a reference timing generator 2, where m=1 and b=1, is shown in FIG. 3. The timing generator 2 includes a signal source 23 of frequency $f_o$ which feeds three channels. The first channel includes in series a 90° delay circuit 20, a Schmitt trigger 21 with output signal $f_{o21}$ and a monostable 25 with output signal $f_{o25}$ which is fed to quadrature sampling circuit 8. The second channel includes in series a Schmitt trigger 22 with output signal $f_{o22}$ and a monostable 24 with output signal $f_{o24}$ which is fed to in-phase sampling circuit 7. The output signals $f_{o21}$, $f_{o22}$, $f_{o24}$ and $f_{o25}$ are illustrated in FIG. 4. The third channel consists of a line between the signal source 23 and mixer 3 to feed the signal $f_o$ to the mixer 3. In this particular case, the period $T_s = m/f_o$ where m=1 and the delay=$(b)/(4f_o)$ where b=1.

In a further implementation of the present invention, the timing generator 2 in FIG. 1 provides pulses to sampling circuit 8 such that the quadrature sampler is triggered at two instants during each period $T_s$, i.e. both at a shift of b $\frac{1}{4}$ periods before and b $\frac{1}{4}$ periods after the in-phase sampler is triggered. The period $T_s$ referred to is the period = $m/f_o$.

Figure 5:
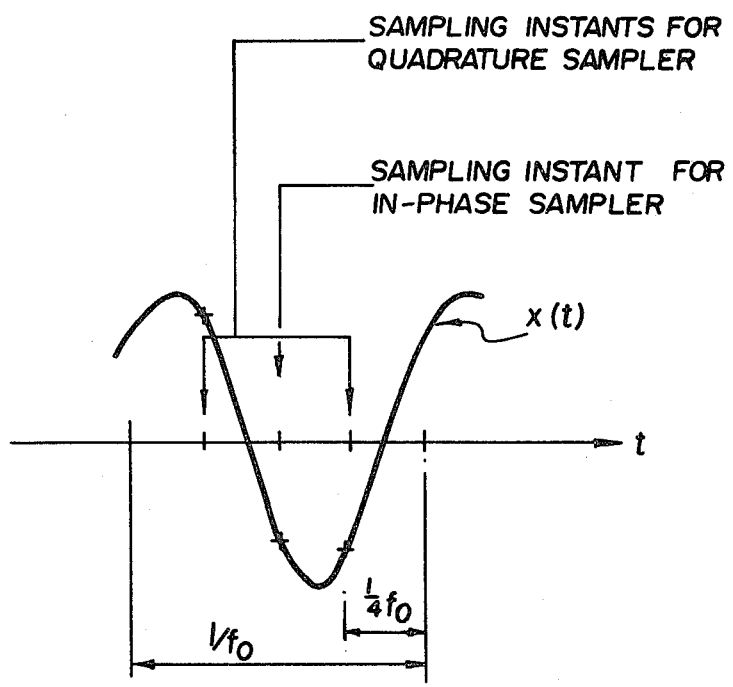
FIG. 5 illustrates the sampling instants when the shift for the quadrature sampling instants is both positive and negative.

The sampling instants for $x_c(t)$ and $x_s(t)$ are shown in FIG. 5. The sampling method used to obtain the samples of $x_c(t)$ is the same as that used in the method discussed previously. However, the corresponding sample for $x_s(t)$ is now to be derived from the difference of the samples of $x_A(t)$ taken both b $\frac{1}{4}$ periods before and b $\frac{1}{4}$ periods after the sampling instant used to obtain $x_c(t)$.

The quadrature sample, corresponding to the time $im/f_o$, is to be given by the quantity $s_s(im/f_o)$, which is defined by $$s_s\left(\frac{im}{f_o}\right) = -\frac{1}{2}\left[x\left(\frac{im}{f_o} + \frac{b}{4f_o}\right) - x\left(\frac{im}{f_o} - \frac{b}{4f_o}\right)\right] \quad (6)$$

Substituting equation (1) into equation (6), we obtain:

$$2s_s\left(\frac{im}{f_o}\right) = -x_c\left[\frac{im}{f_o} + \frac{b}{4f_o}\right]\cos 2\pi f_o\left[\frac{im}{f_o} + \frac{b}{4f_o}\right] \quad (7)$$
$$+ x_c\left[\frac{im}{f_o} - \frac{b}{4f_o}\right]\cos 2\pi f_o\left[\frac{im}{f_o} - \frac{b}{4f_o}\right]$$
$$+ x_s\left[\frac{im}{f_o} + \frac{b}{4f_o}\right]\sin 2\pi f_o\left[\frac{im}{f_o} + \frac{b}{4f_o}\right]$$
$$- x_s\left[\frac{im}{f_o} - \frac{b}{4f_o}\right]\sin 2\pi f_o\left[\frac{im}{f_o} - \frac{b}{4f_o}\right]$$

For all integer values of i, b, and m, where i is the sample index, and b and m remain constant, $$s_s\left(\frac{im}{f_o}\right) = \frac{1}{2}\left[x_s\left(\frac{im}{f_o} + \frac{b}{4f_o}\right) + x_s\left(\frac{im}{f_o} - \frac{b}{4f_o}\right)\right] \quad (8)$$

If the signal x(t) is narrow-band, the low-pass signal $x_s(t)$ will not change significantly over a $\frac{1}{2}$-cycle of the center frequency $f_o$, as shown in FIG. 5. Therefore, the approximation can be made $$x_s\left(\frac{im}{f_o} + \frac{b}{4f_o}\right) \approx x_s\left(\frac{im}{f_o} - \frac{b}{4f_o}\right) \approx x_s\left(\frac{im}{f_o}\right) \quad (9)$$

Substituting (9) into (8):

$$s_s\left(\frac{im}{f_o}\right) \approx x\left(\frac{im}{f_o}\right) \quad (10)$$

where the approximation is valid for narrow-band signals. Therefore, the quantity $s_s(t)$ defined by (6) will give a reasonable approximation to the actual value of the low-pass signal $x_s(t)$ at times $im/f_o$.

The Fourier transform $S_s(f)$ of the signal $s_s(t)$ may be taken from equation (8)

$$S_s(f) = F\{s_s(t)\} = \tfrac{1}{2}\left[X_s(f)\exp\left(j2\pi f \frac{b}{4f_o}\right) + \right.$$

(11)

$$\left. X_s(f)\exp\left(-j2\pi f \frac{b}{4f_o}\right)\right]$$

$$= X_s(f) \cdot \cos\left(\frac{\pi}{2} \frac{fb}{f_o}\right)$$

where $X_s(f)$ if the Fourier transform of $x_s(t)$. It may be seen from (11) that this present type of sampling system does not induce a linear phase shift term into the spectrum of $x_s(t)$, as does the previous system. Note, however, that the sample spectrum $S_s(f)$ is the true spectrum $X_s(f)$ weighted by the term $$\cos\left(\frac{\pi}{2} \frac{fb}{f_o}\right).$$

If the highest frequency component $f_H$ in $X_s(f)$ satisfies the inequality $$f_H < < \frac{2}{\pi} \frac{f_o}{b} \quad (12)$$

then the effect of the cos ( ) weighting term becomes negligible.

Many modifications in the above described embodiments of the invention can be carried out without departing from the scope thereof and therefore the scope of the present invention is intended to be limited only by the appended claims.

We claim:

1. A method of determining the in-phase (I) and quadrature (Q) components of a bandpass signal x(t) having a center frequency $f_c$ and a bandwidth 2 w comprising:
   (a) heterodyning the signal x(t) from its center frequency $f_c$ to an intermediate frequency $f_o$;
   (b) dividing the heterodyned signal into first and second substantially identical signals;
   (c) sampling the first divided signal at an instant during successive periods $T_s$ where $T_s = m/f_o$ and m is an integer, to provide an output which represents the I component;
   (d) sampling the second divided signal during successive periods $T_s$ wherein the sampling instants are shifted by $b/4f_o$ with respect to the sampling instant of the first divided signal, where b is an odd integer, to provide an output which represents the Q component; and
   (e) making a time shift correction of $b/4f_o$ to the output representing the Q component when $f_o \geq 20$ w.
2. A method as claimed in claim 1 where $w \leq f_o \leq f_c$.
3. A method as claimed in claim 1 where $$-m \leq \frac{b+1}{2} \leq m.$$

4. A method of determining the in-phase (I) and quadrature (Q) components of a bandpass signal x(t) having a center frequency $f_c$ and a bandwidth 2 w comprising:
   (a) heterodyning the signal x(t) from its center frequency $f_c$ to an intermediate frequency $f_o$;
   (b) dividing the heterodyned signal into first and second substantially identical signals;
   (c) sampling the first divided signal at an instant during successive periods $T_s$ where $T_s = m/f_o$ and m is an integer, to provide an output which represents the I component; and
   (d) sampling the second divided signal at a first and a second sampling instant during each successive period $T_s$ wherein the first sampling instant is advanced by $b/4f_o$ with respect to the sampling instant of the first divided signal and the second sampling instant is delayed by $b/4f_o$ with respect to the sampling instant of the first divided signal, where b is an odd integer, to provide an output which represents the Q component.
5. A method as claimed in claim 4 where $w \leq f_o \leq f_c$.
6. A method as claimed in claim 4 where $f_o \geq 20$ w.
7. A method as claimed in claim 4 where $$-m \leq \frac{b+1}{2} \leq m.$$

8. A method of determining the in-phase (I) and quadrature (Q) components of a bandpass signal x(t) having a center frequency $f_c$ and a bandwidth 2 w comprising:
   (a) heterodyning the signal x(t) from its center frequency $f_c$ to an intermediate frequency $f_o$;
   (d) dividing the heterodyned signal into first and second substantially indentical signals;
   (c) sampling the first divided signal at an instant during successive periods $T_s$ where $T_s = m/f_o$ and m is an integer, to provide an output which represents the I component;
   (d) sampling the second divided signal during each successive period $T_s$ wherein the sampling instant is advanced by $b/4f_o$ with respect to the sampling instant of the first divided signal, where b is an odd integer, to provide an output which represents the Q component; and
   (e) makng a time shift correction of $b/4f_o$ to the output representing the Q component when $f_o < 20$ w.
9. A method of determining the in-phase (I) and quadrature (Q) component of a bandpass signal x(t) having a center frequency $f_c$ and a bandwidth 2 w comprising:
   (a) dividing the signal x(t) into first and second substantially identical signals;
   (b) sampling the first divided signal at an instant during successive periods $T_s$ where $T_s = m/f_c$ and m is an integer, to provide an output which represents the I component; and
   (c) sampling the second divided signal at a first and a second sampling instant during each successive period $T_s$ wherein the first sampling instant is advanced by $b/4f_c$ with respect to the sampling instant of the first divided signal, and the second sampling instant is delayed by $b/4f_c$ with respect to the sampling instant of the first divided signal, where b is an odd integer, to provide an output which represents the Q component.
10. Apparatus for determining the in-phase I, and quadrature Q, components of a bandpass signal x(t) of center frequency $f_c$ and bandwidth 2 w comprising:
    (a) divider means for receiving the signal x(t) and for dividing the signal x(t) into first and second substantially identical signals at first and second outputs;

(b) first sampling means and second sampling means coupled respectively to the first and second divider means outputs; and (c) a timing generator of frequency $1/T_s$ where $T_s = m/f_c$ and m is an integer, the timing generator being coupled to the first sampling means to sample the first divided signal at an instant during successive periods $T_s$ providing an output which represents I, the timing generator being further coupled to the second sampling means to sample the second divided signal at a first and a second sampling instant during each successive period $T_s$, the first sampling instant being advanced by $b/4f_c$ with respect to the sampling instant of the first divided signal and the second sampling instant being delayed by $b/4f_c$ with respect to the sampling instant of the first divided signal, where b is an odd integer, providing an output which represents Q.

11. Apparatus for determining the in-phase, I, and quadrature, Q, components of a bandpass signal x(t) of center frequency $f_c$ and bandwidth 2 w comprising:

(a) mixer means for receiving the signal x(t);

(b) a signal source of frequency $f_d$ coupled to the mixer means for heterodyning the signal x(t) to an intermediate frequency $f_o$;

(c) divider means coupled to the mixing means for dividing the heterodyned signal into first and second substantially identical signals at first and second outputs;

(d) first sampling means and second sampling means coupled respectively to the first and the second divider means output; and (e) a timing generator of frequency $1/T_s$ where $T = m/f_o$ and m is an integer, the timing generator being coupled to the first sampling means to sample the first divided signal at an instant during successive periods $T_s$ providing an output which represents I, the timing generator being further coupled to the second sampling means to sample the second divided signal at a first and a second sampling instant during each successive period $T_s$, the first sampling instant being advanced by $b/4f_o$ with respect to the sampling instant of the first divided signal, and the second sampling instant being delayed by $b/4f_o$ with respect to the sampling instant of the first divided signal, where b is an odd integer, providing an output which represents Q.

12. Apparatus as claimed in claim 10 or 11 in which the outputs of the first sampling means and the second sampling means are coupled to signal processor means.

13. Apparatus as claimed in claim 10 or 11 where $$-m \leq \frac{b+1}{2} \leq m.$$

14. Apparatus as claimed in claim 11 wherein $w \leq f_o \leq f_c$.

15. Apparatus as claimed in claim 11 wherein $f_o \geq 20$ w.

* * * * *